US008497213B2

(12) United States Patent
Yasui et al.

(10) Patent No.: US 8,497,213 B2
(45) Date of Patent: Jul. 30, 2013

(54) PLASMA PROCESSING METHOD

(75) Inventors: Naoki Yasui, Kudamatsu (JP); Seiichi Watanabe, Hofu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1147 days.

(21) Appl. No.: 12/013,537

(22) Filed: Jan. 14, 2008

(65) Prior Publication Data

US 2008/0182419 A1  Jul. 31, 2008

(30) Foreign Application Priority Data

Jan. 16, 2007  (JP) .................................. 2007-007437

(51) Int. Cl.
*H01L 21/302* (2006.01)
(52) U.S. Cl.
USPC ........... 438/714; 438/706; 438/715; 438/717; 216/58
(58) Field of Classification Search
USPC ................. 438/706, 710, 712, 708, 715, 717, 438/735, 736, 781, 714, 737; 216/58, 62, 216/67
See application file for complete search history.

(56) References Cited

U.S. PATENT DOCUMENTS

| 7,371,690 | B2 * | 5/2008 | Negishi et al. | 438/714 |
| 7,662,718 | B2 * | 2/2010 | Abatchev et al. | 438/689 |
| 7,670,760 | B2 * | 3/2010 | Shen et al. | 430/330 |
| 2005/0054194 | A1 * | 3/2005 | Tsai et al. | 438/638 |
| 2005/0277289 | A1 * | 12/2005 | Wagganer et al. | 438/637 |
| 2005/0277389 | A1 * | 12/2005 | Friedrich et al. | 455/114.3 |
| 2007/0042607 | A1 * | 2/2007 | Sadjadi et al. | 438/715 |

FOREIGN PATENT DOCUMENTS

| JP | 2001-308076 | 11/2001 |
| WO | WO 2004/003988 | 1/2004 |

OTHER PUBLICATIONS

N. Negishi, et al., Deposition Control for Reduction of 193 nm Photoresist Degradation in Dielectric Etching, J. Vac. Sci. Tehnol. B23 (1), Jan./Feb. 2005, 217-223.

* cited by examiner

*Primary Examiner* — Lan Vinh
(74) *Attorney, Agent, or Firm* — Antonelli, Terry, Stout & Kraus, LLP.

(57) ABSTRACT

The invention provides a method for subjecting laminated thin films disposed below a photoresist mask pattern to plasma processing, wherein the roughness on the side walls of the formed pattern is reduced, and the LER and LWR are reduced. When etching a material to be processed to form a gate electrode including thin films such as a gate insulating film 205, a conducting layer 204, a mask layer 203 and an antireflection film 202 laminated on a semiconductor substrate 206 and a photoresist mask pattern 201 disposed on the antireflection film, prior to etching the mask pattern 201, plasma is generated from nitrogen gas or a mixed gas including nitrogen gas and deposition gas to subject the mask pattern 201 to a plasma curing process so as to reduce the roughness on the surface and side walls of the mask pattern 201, and then the laminated thin films 202, 203 and 204 disposed below the mask pattern 201 are subjected to a plasma etching process.

10 Claims, 6 Drawing Sheets

PLASMA PROCESSING METHOD

The present application is based on and claims priority of Japanese patent application No. 2007-7437 filed on Jan. 16, 2007, the entire contents of which are hereby incorporated by reference.

BACKGROUND OF THE INVENTION

1. Field of the Invention

The present invention relates to plasma processing methods, and more specifically, to plasma processing methods suitable for subjecting semiconductor substrates to surface treatments using plasma. The present invention also relates specifically to plasma processing methods suitable for forming gate electrodes in MOS (metal oxide semiconductor) transistors using photolithography.

2. Description of the Related Art

Generally, photolithography techniques are applied in the process of manufacturing semiconductors. Photolithography techniques are composed of the following steps. First, a photoresist material is applied on laminated thin film layers disposed on a semiconductor substrate, which is exposed to ultra violet rays in an exposure apparatus. Thereby, the circuit pattern of a photoresist mask is transferred onto the photoresist material via exposure, which is then developed. Thereafter, the desired circuit pattern is formed via an etching process using plasma. In the exposure process of the photolithography technique, ultraviolet rays and the like used for exposing the resist material must reach the bottom of the resist material with sufficient optical intensity, but due to standing waves caused by reflection at the thin film surface or diffused reflection at the stepped portions of the thin film, drawbacks such as exposure of unnecessary portions of the photoresist material and uneven exposure occur. When the photoresist material is developed, undesirable roughness is formed on the surface and side walls of the formed circuit pattern of the photoresist. Further, undesirable roughness occurs to the surface and side walls of the resist due for example to uneven resist polymer size, aggregation of polymers having different polarities and uneven oxygen diffusion according to chemical amplification reaction.

Furthermore, a plasma processing apparatus is generally used for the etching process for transferring the developed photoresist circuit pattern to the laminated thin film disposed below the photoresist. The plasma processing apparatus is composed for example of a vacuum processing chamber, a gas supply unit connected thereto, a vacuum unit for maintaining the pressure within the vacuum processing chamber to a desirable value, an electrode on which the material to be processed, or semiconductor substrate, is placed, and a plasma generating means for generating plasma in the vacuum processing chamber, wherein the etching of the material to be processed placed on the substrate-placing electrode is performed by generating plasma from the processing gas supplied into the vacuum processing chamber through a shower plate or the like via a plasma generating means.

These etching processes are largely classified into, for example, substrate silicon etching for forming isolations and trench capacitors, insulating film etching for forming contact holes and trenches, polysilicon etching or silicide etching for forming gate electrodes of MOS transistors, metal layer etching or high-k gate insulating film etching for forming high-k/metal gate transistors, and metal etching for forming wires.

Japanese Patent Application Laid-Open Publication No. 2001-308076 (patent document 1) discloses a method for forming ultrafine gate electrodes using a photolithography technique in the process of manufacturing semiconductors. According to the document, an insulation film, a conductive layer and an organic material layer are formed on a semiconductor substrate, a first mask pattern of a mask size β is formed on the organic material layer using photolithography, the organic material layer is etched with a mixed gas of $Cl_2$ and $O_2$, the first mask pattern is shrunk to form a second mask pattern of a mask size γ(<β), and the conductive layer is etched using the second mask pattern to obtain gate electrodes of a size smaller than the mask size β.

As described above, undesirable roughness is formed on the surfaces and side walls of the photoresist circuit pattern formed via a general photolithography technique. When the photoresist circuit pattern having such roughness is used as the mask to etch laminated thin films disposed below the mask in a plasma etching apparatus, there occurs a drawback in that undesirable roughness is formed on the side walls of the etched thin films similar to the roughness formed on the surfaces and side walls of the photoresist. For example, in the processing of gate electrodes of a MOS transistor in the process of manufacturing semiconductors, the roughness on the surface of the photoresist is transferred to the side walls of the polysilicon layer during etching of the polysilicon layer, and roughness of a few nm is formed on the side walls of the polysilicon layer. In the prior art gate electrode in which the gate length is a few hundred nm or longer, roughness of a few nm on the side walls of the polysilicon layer rarely affected the performance of the MOS transistor. However, along with the scaling down of the LSI (large scale integration), the gate length has been reduced to the order of tens of nm, according to which the roughness of a few nm on the side walls of the polysilicon layer transferred via the etching process could not be tolerated, since it affects the performance of the MOS transistor greatly.

Actually, a roughness of a few nm on the side walls of the polysilicon layer causes the gate length of the transistor to be reduced locally in some areas, causing a short channel effect, which leads to the increase of leak current and decrease of threshold voltage. Moreover, according to the operation properties of multiple transistors, the roughness of a few nm formed on the side walls of the polysilicon layer causes dispersion of gate length, which leads to fluctuation of transistor performances and deterioration of yield. Such roughness on the sides of the lines of the pattern is called LER (line edge roughness), and the roughness of the line width is called LWR (line width roughness), which affect the semiconductor device properties greatly.

The problems related to LER and LWR in the process of etching polysilicon electrodes of MOS transistors have been described above, but similar problems exist in processing high-k/metal gate structures and three-dimensional MOSFET, such as FIN-FET, which are considered as the structures of next-generation MOSFET transistors.

Furthermore, as the LSI size is scaled down, dry ArF exposure and immersion ArF exposure using argon fluoride laser radiation are used for photolithography, and in the future, the applications of double patterning techniques and EUV (extreme ultra violet) exposure are proposed. In order to cope with such exposure techniques, the molecular structures of photoresist materials are being improved with respect to the exposure light source. However, such improvement in molecular structures causes new drawbacks, such as deterioration of the tolerance of the photoresist mask pattern to plasma etching and insufficient initial film thickness. Such deterioration of the tolerance of the mask pattern to plasma etching or insufficient initial film thickness may cause LER and LWR, which are considered to have even greater impact on the semiconductor device performances when the speed in which the size of the semiconductor devices is scaled down is accelerated.

The influences of the LER and LWR on the forming of gate electrodes in MOS transistor shave been described as an example, but the problems of LER and LWR occur similarly in the art of hole processing, deep trench processing, STI processing, damascene processing and the like, which have drawbacks in that the circuit pattern cannot be etched with high accuracy and that a semiconductor device with a predetermined performance cannot be manufactured.

Especially, a typical example of the problems of LER and LWR regarding the etching of insulating films using fluorocarbon plasma is the generation of striation caused by plasma damage of the resist mask for ArF exposure. Generally, in etching insulating films, a fluorocarbon gas having high depositing property is used to form plasma, and etching is performed using the injection of ions having high energy. During such plasma etching having high deposition property and high energy, the surface roughness of the resist mask having been subjected to ArF exposure is increased through etching, and the increased surface roughness is transferred to the insulating film layer or layer to be etched, causing striation. Known methods for suppressing the increase of surface roughness of the photoresist layer through etching during the etching of insulating films using fluorocarbon plasma include, for example, the use of multilayered resists and the modification of surface material of the photoresist.

"Deposition control for reduction of 193 nm photoresist degradation in dielectric etching", J. Vac. Sci. Technol. B23 (1), January/February 2005, 217-223 (non-patent document 1) discloses a means for suppressing the increase of roughness of the photoresist layer during etching of the insulating film using fluorocarbon plasma.

However, such methods merely suppress the increase of surface roughness of the photoresist layer during etching of the insulating film using fluorocarbon plasma.

As described, in a plasma etching process having a low depositing property and low energy, such as the processing of gate electrodes of MOS transistors using fine photoresist circuit patterns, the problem of LER and LWR caused by unnecessary roughness formed on the surface and side walls of the photoresist circuit pattern prior to etching must be solved. The means for suppressing surface roughness in the etching of insulating films are not effective in solving the problems of unnecessary roughness formed on the surface and side walls of the photoresist circuit pattern prior to etching during the processing of gate electrodes.

As described, the problems of LER and LWR caused by unnecessary roughness formed on the surface and side walls of the photoresist circuit pattern prior to etching in the processing of gate electrodes of MOS transistors using fine photoresist circuit patterns have not yet been solved.

SUMMARY OF THE INVENTION

Therefore, the present invention aims at providing a plasma processing method, especially for forming gate electrodes of MOS transistors, using a plasma processing apparatus capable of reducing the roughness on the surfaces and side walls of the photoresist film formed in the semiconductor substrate using plasma, and further capable of performing a highly accurate etching process capable of preventing deterioration of semiconductor device performances by reducing the roughness on the sidewalls of the thin films subjected to plasma processing.

According to the present invention, plasma is generated using gas containing nitrogen elements to subject the photoresist mask pattern to a plasma curing process (a process for stabilizing coating films or resin films by volatilizing solvents or densifying and modifying films is called a curing process, and especially, such process using plasma is called a plasma curing process), by which the roughness on the surfaces and side walls of the photoresist mask pattern is reduced, and thereafter, the laminated thin films disposed below the photoresist mask pattern are subjected to plasma etching process to reduce the roughness on the sides of the formed pattern and to reduce the LER and LWR.

Further according to the present invention, plasma is generated using gas containing nitrogen elements to initially subject the photoresist mask pattern to a plasma curing process so as to reduce the roughness on the surfaces and side walls of the photoresist mask pattern, and thereafter, a thin film layer disposed directly below the photoresist mask pattern is subjected to plasma etching process, the photoresist mask pattern is subjected again to plasma curing process, a thin film layer disposed below the plasma-processed thin film layer is subjected to plasma etching process, and the photoresist mask pattern and the laminated thin films are alternately respectively subjected to plasma curing process and plasma etching process, by which the roughness on the sides of the laminated thin films is reduced and the LER and LWR are reduced.

The present invention further comprises subjecting the photoresist mask pattern having reduced thickness due to improved lithography resolution to a plasma curing process using plasma generated from a gas mixture including a gas containing a nitrogen element and a deposition gas, so as to reduce the roughness on the surface and the side walls of the photoresist mask pattern while suppressing the vertical etching rate of the photoresist mask pattern during the plasma curing process, and thereafter, subjecting the laminated thin film layer arranged below the photoresist mask pattern to a plasma etching process using the photoresist mask pattern, thereby reducing the roughness on the side walls of the formed pattern and reducing LER and LWR.

The present invention further comprises subjecting the photoresist mask pattern initially having reduced thickness due to improved lithography resolution to a plasma curing process using plasma generated from a gas mixture including gas containing a nitrogen element and a deposition gas, so as to reduce the roughness on the surface and the side walls of the photoresist mask pattern while suppressing the vertical etching rate of the photoresist mask pattern during the plasma curing process, and thereafter, subjecting the thin film layer arranged immediately below the photoresist mask pattern to a plasma etching process, subjecting the photoresist mask pattern again to a plasma curing process to reduce the roughness on the surface and the side walls of the photoresist mask pattern, then subjecting a thin film layer arranged below the thin film layer subjected to the plasma etching process, and alternately performing the plasma curing step of the photoresist mask pattern and the plasma etching step for subjecting each layer of the laminated thin films to plasma etching, thereby reducing the roughness on the side walls of the laminated thin films and reducing the LER and LWR.

Furthermore, by adding one or more gases selected from a group composed of hydrogen bromide gas, gas containing rare gas elements and a gas containing halogen elements as additive gas to the gas used for the plasma curing process, that is, to a gas containing nitrogen elements or a gas mixture composed of gas containing nitrogen elements and deposition gas, the roughness on the side walls of the formed pattern can be reduced, by which the LER and LWR can be reduced and the semiconductor device properties can be improved.

Moreover, by using as deposition gas for the plasma curing process a gas containing at least one or more gases selected from a group composed of methane ($CH_4$), trifluoromethane ($CHF_3$), difluoromethane ($CH_2F_2$), fluoromethane ($CH_3F$), other fluorocarbon gases ($C_xF_y$) and silicon fluoride ($SiF_4$), the roughness on the surface and side walls of the photoresist mask pattern can be reduced while suppressing the vertical etching rate of the photoresist mask pattern of the photoresist during the plasma curing process, by which the LER and LWR can be reduced and the semiconductor device properties can be improved.

The pressure during the plasma curing process should preferably be 0.1 Pa or greater and 100 Pa or smaller, and the RF bias power applied to the material to be processed during the plasma curing process should preferably be 0 W or greater and 100 W or smaller, by which the roughness on the side walls of the formed pattern can be reduced, the LER and LWR can be further reduced, and the semiconductor device properties can be improved. Especially, when subjecting the photoresist mask pattern having reduced thickness due to improved lithography resolution to a plasma curing process, the RF bias power should be set to 0 W, thereby suppressing the vertical etching rate of the photoresist mask pattern during the plasma curing process and reducing the roughness on the surface and the side walls of the photoresist mask pattern, and thereafter, the laminated thin film layer arranged below the photoresist mask pattern should be subjected to the plasma etching process, by which the roughness on the side walls of the formed pattern can be reduced, and the LER and LWR can be reduced.

Furthermore, by setting the processing temperature of the material to be processed during the plasma curing process of the photoresist mask pattern to 20° C. or higher and 200° C. or lower, it becomes possible to further reduce the LER and LWR and improve the semiconductor device properties.

Even further, by adopting an ECR (electron cyclotron resonance) etching apparatus as the plasma etching apparatus, the ECR surface as the main plasma generation region, which is the region with a magnetic flux density of 875 G when the microwave oscillating frequency is 2.45 GHz, can be controlled arbitrarily via magnetic field coil current, and by optimizing the distance between the main plasma generation region and the wafer which is the material to be processed, it becomes possible to further reduce the roughness on the side walls of the formed pattern, by which the LER and LWR can be further reduced and the semiconductor device properties can be improved. The distance between the main plasma generation region and the wafer which is the material to be processed cannot be changed in other etching apparatuses such as an ICP (inductively coupled plasma) etching apparatus or a parallel plate plasma etching apparatus. In the above-mentioned ECR etching apparatus, it becomes possible to set the coil current to a value most suitable for the plasma curing process and also set the coil current to that most suitable for the plasma etching process, by which the most preferable etching properties can be realized.

DETAILED DESCRIPTION OF THE PREFERRED EMBODIMENTS

Now, a plasma processing method using a microwave ECR etching apparatus according to one embodiment of the present invention will be described with reference to FIGS. 1 through 8.

Figure 1:
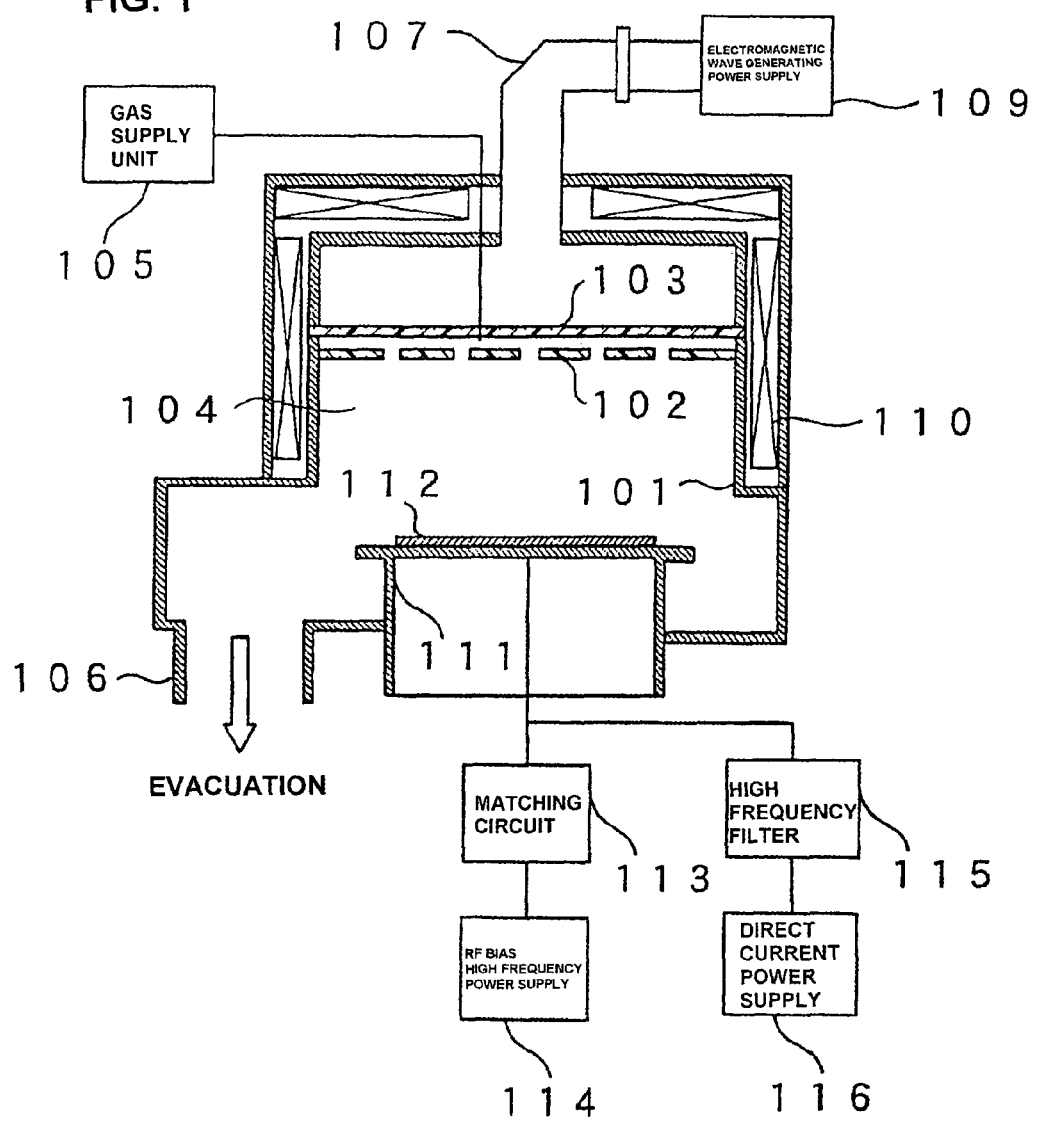
FIG. 1 is a vertical cross-sectional view illustrating the outline of a microwave ECR etching apparatus according to a first embodiment of the present invention.

FIG. 1 illustrates a plasma processing apparatus used in the present embodiment. On an upper portion of a vacuum reactor 101 having its top opened are disposed a shower plate 102 formed for example of quartz for introducing etching gas into the vacuum reactor 101 and a dielectric window 103 formed for example of quartz, which are air-tightly sealed to define a processing chamber 104. A gas supply unit 105 is connected to the shower plate 102 for supplying etching gas. Further, an evacuation device not shown is connected to the vacuum reactor 101 via a vacuum evacuation port 106.

A waveguide 107 (or antenna) for emitting electromagnetic waves is disposed above the dielectric window 103 for transmitting the power for generating plasma to the processing chamber 104. The electromagnetic waves transmitted to the waveguide 107 (or antenna) is generated from an electromagnetic wave generating power supply 109. The frequency of the electromagnetic waves is not specifically restricted to a certain range, but in the present embodiment, a microwave with a frequency of 2.45 GHz is used. Magnetic field forming coils 110 are disposed on the outer circumference portion of the processing chamber 104 for forming a magnetic field, and the power supplied through the electromagnetic wave generating power supply 109 interacts with the formed magnetic field to generate high density plasma within the processing chamber 104.

Furthermore, a wafer mounting electrode 111 is disposed on a lower portion of the vacuum reactor 101 facing the shower plate 102. The wafer mounting electrode 111 has its surface coated with a sprayed film (not shown), and a direct current power supply 116 is connected thereto via a high frequency filter 115. Further, a RF bias high frequency power supply 114 is connected via a matching network 113 to the wafer mounting electrode 111. The wafer mounting electrode 111 is connected to a temperature controller not shown.

The wafer 112 carried into the processing chamber 104 is chucked onto the wafer mounting electrode 111 via the electrostatic chucking force of the direct current voltage applied from the direct current power supply 116, and the temperature thereof is controlled. After feeding desirable etching gas into the processing chamber from the gas supply unit 105, the interior of the vacuum reactor 101 is set to a predetermined pressure, and plasma is generated in the processing chamber 104. By applying high frequency power through the RF bias high frequency power supply 114 connected to the wafer mounting electrode 111, ions from the plasma are drawn toward the wafer and the wafer 112 is etched.

Figure 2:
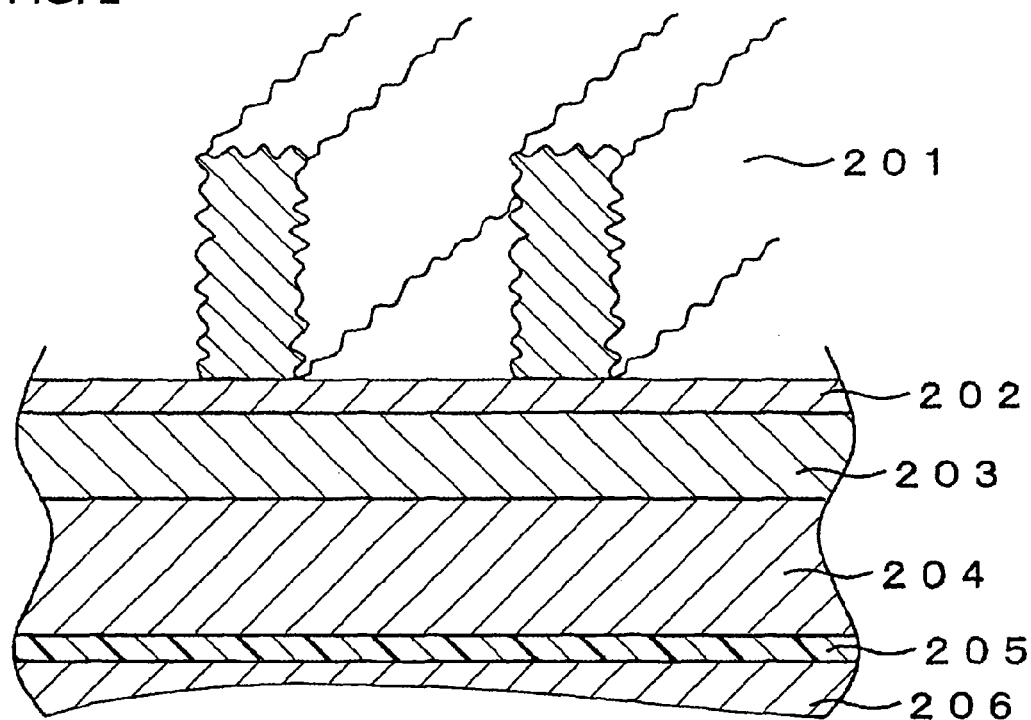
FIG. 2 is an explanatory view showing in frame format the cross-section of a photoresist pattern formed by a prior art method.
Figure 3:
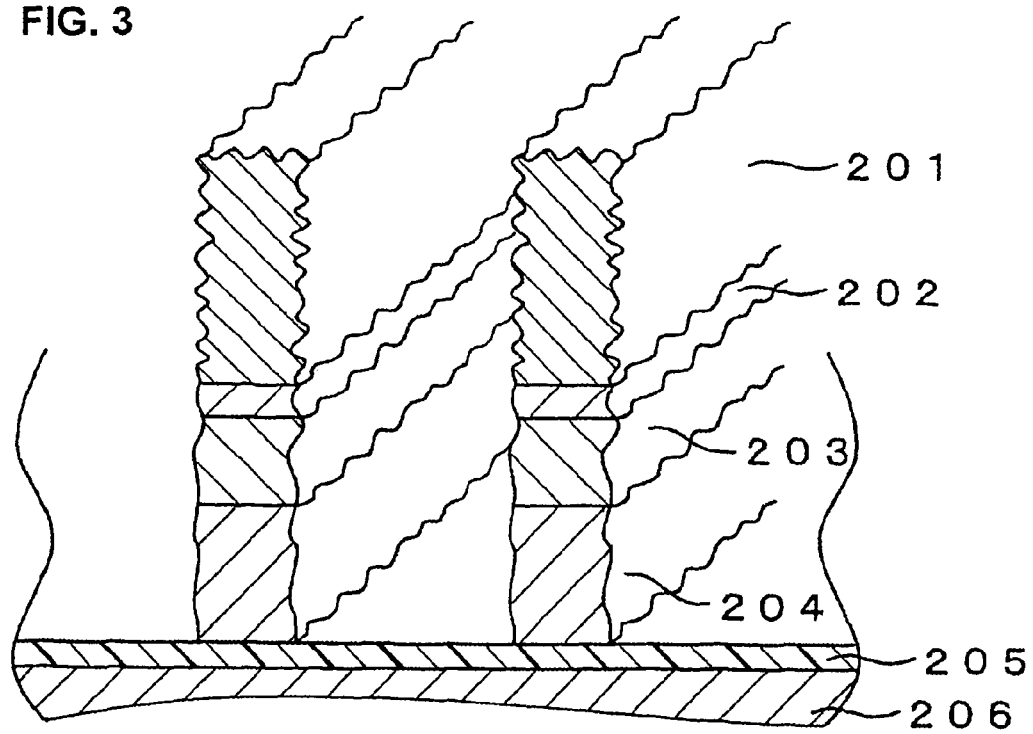
FIG. 3 is an explanatory view showing in frame format the cross-section of a pattern having been etched according to the prior art method.

Next, the prior art plasma processing method for etching a semiconductor substrate and the like using plasma is described with reference to FIGS. 2 and 3. FIGS. 2 and 3 illustrate in cross-section a general method for forming gate electrodes of a MOS transistor. As shown in FIG. 2, a gate insulating film layer 205 is formed on the semiconductor substrate 206, and a conducting film layer 204 is formed thereon by depositing a gate electrode material. Further, a mask layer 203 (such as a hard mask layer) having photo sensitive property, developing property and etching property that differ from the photoresist material is formed on the conducting film layer 204. Thereafter, an antireflection film 202 is formed on the mask layer 203 as an antireflection film used when exposing the photoresist by coating either organic material to form a BARC (bottom antireflection coating) layer or inorganic material to form a BARL (bottom antireflection layer). Finally, a resist material is applied on the antireflection film 202 via spin coating, and thereafter, a circuit pattern is exposed through a projection exposure method using an ArF laser or the like, which is developed to form a photoresist mask pattern 201.

In the exposure process adopting a photolithography method used in a general semiconductor manufacturing process, the ultraviolet radiation and the like for exposing the resist material must reach the bottom portion of the resist material with sufficient optical intensity, but a standing wave may occur by the reflection at the surface of the thin film or by the diffused reflection at the stepped portions of the thin film, causing exposure of unnecessary portions of the photoresist material or uneven exposure. If the photoresist material exposed in this manner is developed, undesirable roughness is formed on the surface and side walls of the photoresist mask pattern, as shown in FIG. 2. Furthermore, such roughness on the surface and side walls of the resist is also caused by the uneven polymer size of the resist, aggregation of polymer having different polarities and uneven acid diffusion during chemical amplification reaction.

According to the prior art plasma etching method, the laminated thin film layers below the photoresist mask pattern are etched using the photoresist mask pattern 201 having such roughness on the surface and side walls. For example, with respect to the portion not covered by the photoresist mask pattern 201, plasma processing is performed using etching conditions (such as gas species, pressure, microwave output, coil current and high frequency power supply output) most suitable for etching the antireflection film 202 disposed immediately below the photoresist mask pattern 201. Furthermore, etching is sequentially performed under most suitable etching conditions for processing the mask layer 203 and the conductive film layer 204 disposed below the antireflection film 202. At this time, it is possible to perform etching of the mask layer 203, and thereafter, remove the photoresist mask pattern layer 201 and the antireflection film 202 by ashing, and then etch the conductive film layer 204 using the mask layer 203.

FIG. 3 illustrates an example of the result of etching a gate electrode via etching according to the prior art plasma processing method. When the laminated thin films below the photoresist mask pattern 201 are etched using the photoresist mask pattern 201 having roughness on the surface and side walls, as shown in FIG. 2, the roughness on the side walls of the photoresist mask pattern 201 is transferred to the side walls of the laminated thin films disposed under the mask, as shown in FIG. 3. Especially when processing a gate electrode of a MOS transistor, roughness of a few nm is formed on the side walls of a polysilicon layer which is the conducting layer. As described, when the gate length is in the order of a few hundred mm or longer, the surface roughness of a few nm on the side walls of the polysilicon layer rarely affects the properties of the MOS transistor. However, along with the scaling-down of the size of the LSI, the gate length is reduced to approximately few tens of nm, and the roughness of a few nm on the side walls of the polysilicon layer transferred via etching could not be tolerated, since it affects the performance of the MOS transistor significantly. Actually, a roughness of a few nm causes a locally short gate length portion to be formed in the transistor, causing a short channel effect leading to the increase of leak current and deterioration of threshold voltage. Furthermore, with respect to the operation performance of multiple transistors, the dispersion of gate length causes fluctuation of transistor performance and yield deterioration. The roughness on the sides of the line of the pattern is called LER and the roughness of the line width is called LWR, which affect the semiconductor device performance significantly.

Figure 4:
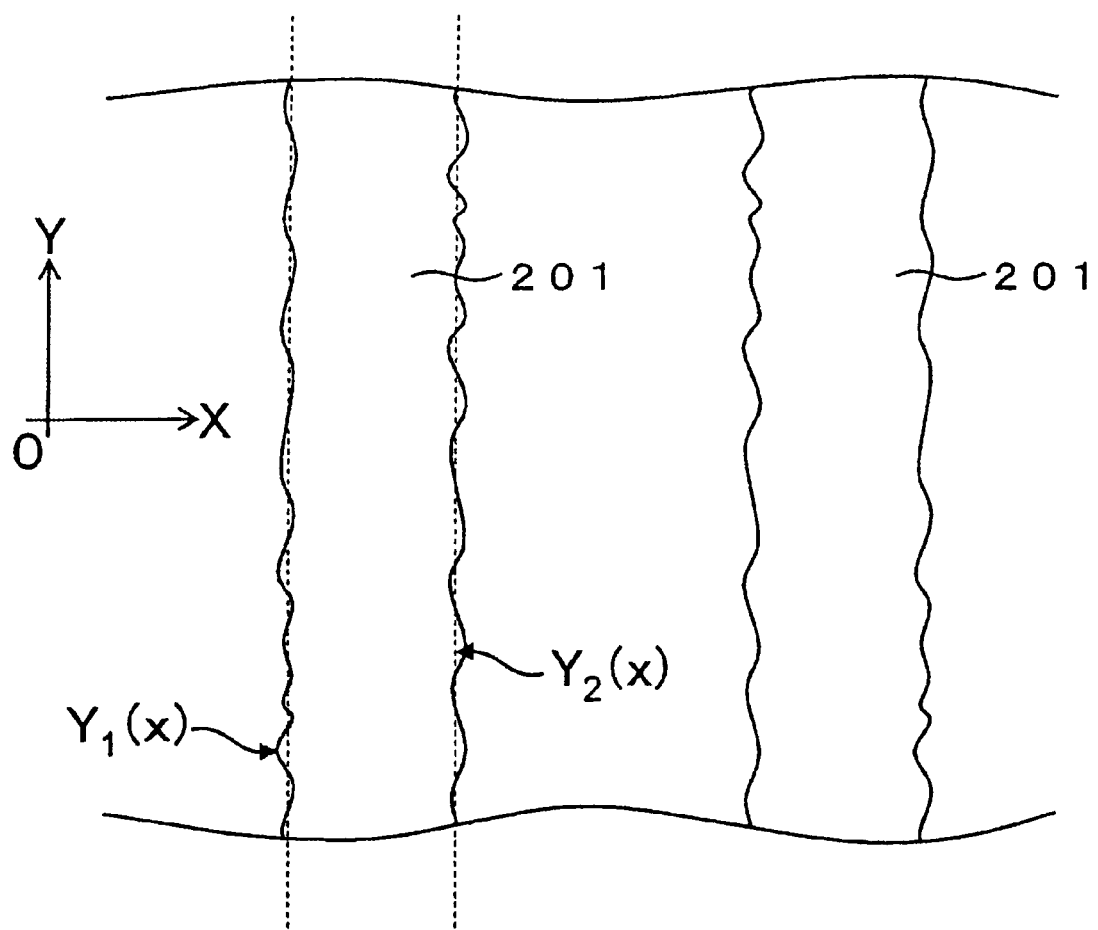
FIG. 4 is an explanatory view showing in frame format the LWR.

FIG. 4 shows a pattern diagram observing the gate electrode pattern having been etched using plasma from above. In general, the LWR which is the roughness of the line width is defined by the following expression (1).

$$LWR(3\sigma) = 3 \cdot \sqrt{\frac{\Sigma_i \{|y_1(x_i) - y_2(x_i)| - CD\}^2}{N-2}} \quad (1)$$

Here, $y_1(x)$ is an end shape function of the left side of the line, $y_2(x)$ is an end shape function of the right side of the line, and N is the number of samples of the line width. Further, the line width is called CD (critical dimension), which is the average value of line width defined by the following expression (2)

$$CD = |y_{1ave} - y_{2ave}| \quad (2)$$

[Embodiment 1]

Next, the plasma processing method for performing etching using plasma according to a first embodiment of the present invention will be described with reference to FIGS. 5 through 8.

Figure 5:
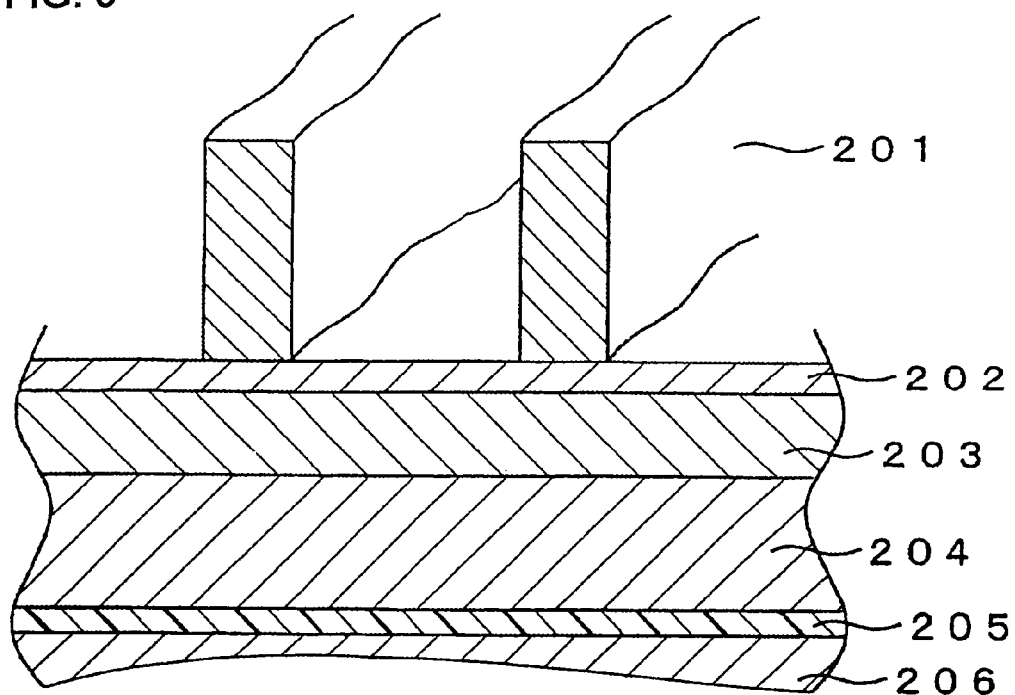
FIG. 5 is an explanatory view showing in frame format the cross-section of a photoresist pattern after a plasma curing process according to the first embodiment of the present invention.

According to the plasma processing method of the present invention, with respect to the photoresist mask pattern 201 having roughness on the surface and side walls thereof, a plasma curing process is performed to reduce the roughness on the surface and side walls of the photoresist mask pattern 201 as a pretreatment for etching the laminated thin films disposed below the photoresist mask pattern. FIG. 5 illustrates the shape of the material being processed after generating plasma from nitrogen gas and performing a plasma curing process. By performing a plasma curing process, it becomes possible to reduce the roughness on the surface and side walls of the photoresist mask pattern 201 caused by exposure and development of the photoresist material, and therefore, the laminated thin films formed under the photoresist mask pattern 201 can be etched with the roughness on the surface and side walls of the photoresist mask pattern 201 reduced.

The plasma curing process is performed using the plasma processing apparatus of FIG. 1, wherein by sealing nitrogen gas with predetermined pressure in the processing chamber, applying microwaves to the processing chamber and generating plasma in the processing chamber, the photoresist mask on the semiconductor substrate is subjected to plasma curing process. As for the conditions for performing plasma processing in the plasma curing process, the plasma curing pressure is 0.1 Pa or greater and 100 Pa or smaller, the microwave output is 100 W or greater and 2000 W or smaller, and the RF bias power applied on the material to be processed is 0 W or greater and 100 W or smaller.

Further, the plasma curing process can be optimized by controlling the coil current and adjusting the distance between the main plasma generating region (ECR surface) and the wafer.

Figure 6:
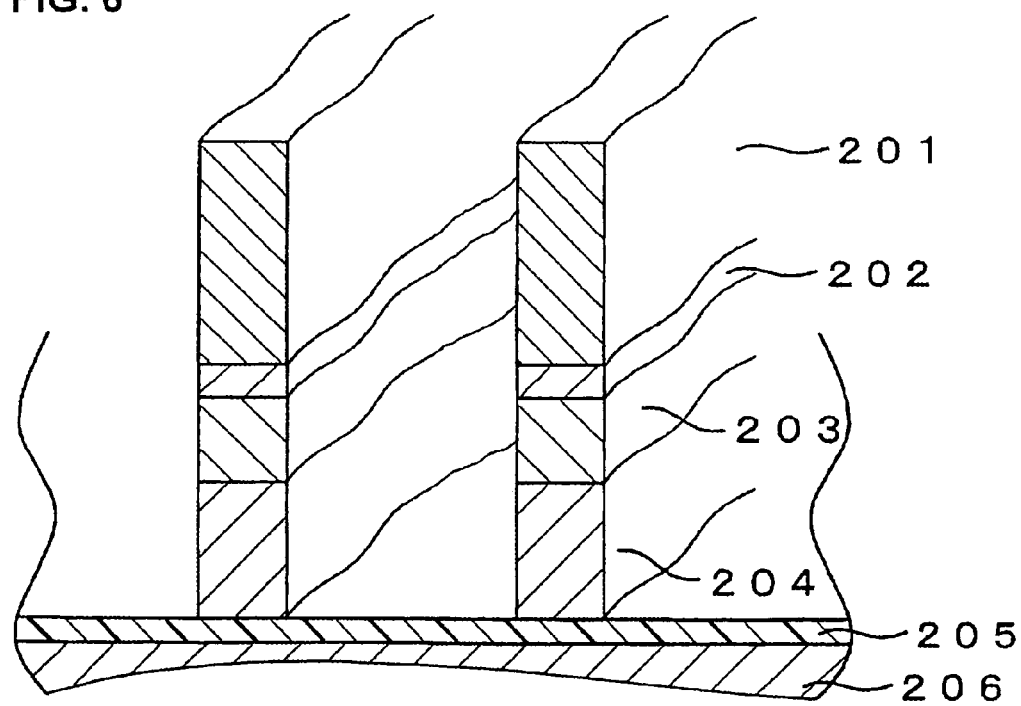
FIG. 6 is an explanatory view showing in frame format the cross-section of a pattern after performing plasma etching process using a plasma curing process according to the first embodiment of the present invention.

FIG. 6 illustrates the shape of the processed material after performing a plasma curing process using plasma generated from nitrogen gas to reduce the roughness on the surface and side walls of the photoresist mask pattern 201, and then etching the laminated thin films disposed below the photoresist mask pattern 201. The roughness on the side walls of the thin film layers can be reduced by etching the thin films, which are an antireflection film 202, a mask layer 203 and a conducting film layer 204, after performing the plasma curing process. Actually, after performing the plasma curing process, etching is performed using etching conditions (such as gas species, pressure, microwave output, coil current and high frequency power output) optimized for processing the antireflection film 202 disposed immediately below the photoresist mask pattern, and then the etching of other thin film layers are performed sequentially using etching conditions optimized for processing the mask layer 203 and the conducting film layer 204 disposed below the antireflection film 202. Thereby, the roughness on the side walls of the thin film layers is reduced, and therefore, the LER and LWR are reduced. Moreover, the plasma curing process not only reduces the roughness on the surface and side walls of the photoresist mask pattern 201 but also enables to achieve equivalent effects even if a portion of the antireflection film 202 is etched.

Moreover, upon reducing the roughness on the side walls of the pattern via plasma curing process using plasma generated from nitrogen gas, it is possible to perform the plasma curing process again prior to etching the respective thin film layers. For example, it is possible to perform a plasma curing process of the photoresist mask pattern 201, etch the organic layer or antireflection film 202 disposed directly below the photoresist mask pattern, perform the plasma curing process of the photoresist mask pattern 201 again, etch the mask layer 203, perform the plasma curing process again, and lastly, etch the conducting film layer 204. Such plasma processing method is effective when plasma curing process of the photoresist mask pattern 201 is performed initially to reduce the roughness on the surface and side walls of the photoresist mask pattern, but roughness is formed again on the surface and side walls of the photoresist during etching of the thin film layers and the re-formed roughness is transferred to the thin film layers. This phenomenon is caused by the surface roughness of the photoresist being deteriorated by the deposition components in the etching gas and the high energy ions being incident during etching of the respective thin film layers, but by alternately repeating the plasma curing process and the etching of the respective thin film layers, it becomes possible to reduce the re-formed roughness and to reduce the roughness on the side walls of the thin film layers.

Figure 7:
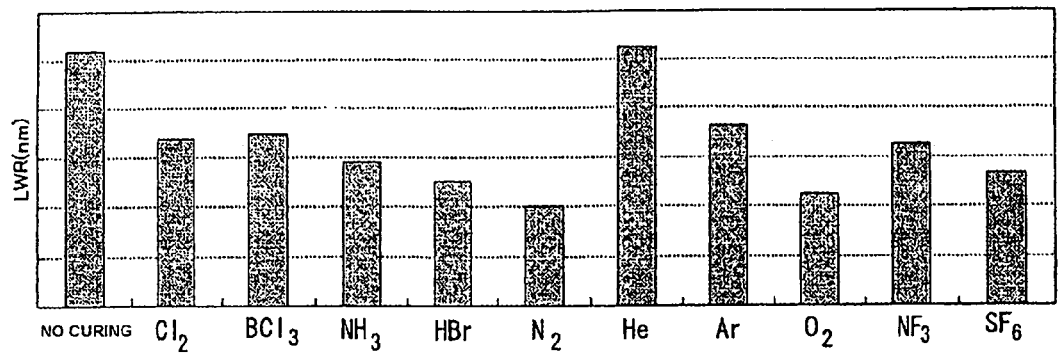
FIG. 7 is a view showing the plasma curing gas species dependency of LWR according to the plasma curing process of the first embodiment of the present invention.

Further, FIG. 7 shows the gas species dependency of the LWR reduction effect in the plasma curing process. Chlorine gas ($Cl_2$), boron trichloride ($BCl_3$), ammonia gas ($NH_3$), hydrogen bromide gas (HBr), nitrogen gas ($N_2$), helium gas (He), argon gas (Ar), oxygen gas ($O_2$), nitrogen trifluoride gas ($NF_3$) and sulfur hexafluoride gas ($SF_6$) are used as gas species for the plasma curing process. The LWR value is reduced by the plasma curing process regardless of which gas is used, but the LWR is most reduced by the plasma curing process using nitrogen gas. With respect to the LWR reducing effect of the plasma curing process, the gas coming in second place following nitrogen gas is oxygen gas (as described later, the CD is greatly reduced and even sometimes extinguished), and gases containing halogen elements (such as chlorine gas and boron trichloride gas), or ammonia gas and argon gas containing nitrogen elements contribute in reducing the LWR, though the effects thereof are small. This is considered to be caused by the carbonil radicals and ester radicals constituting a portion of the organic polymer composing the photoresist easily reacting with the nitrogen radicals and hydrogen bromide radicals, and lactone radicals and the like in the photoresist polymer being easily eliminated.

The wafer processing temperature in the plasma curing process of the photoresist mask pattern should preferably be 20° C. or higher, considering radical reaction and elimination of the lactone group. Further, upon considering the change of phase of the photoresist material by glass transition, the processing temperature of the wafer during the plasma curing process should preferably be lower than the glass transition temperature of the photoresist material after forming circuit patterns, which is, for example, 200° C. or lower. However, the most suitable processing temperature of the wafer is not always the same for the plasma curing process and the plasma etching process, the wafer processing temperature can be varied between the plasma curing process and the plasma etching process.

Figure 8:
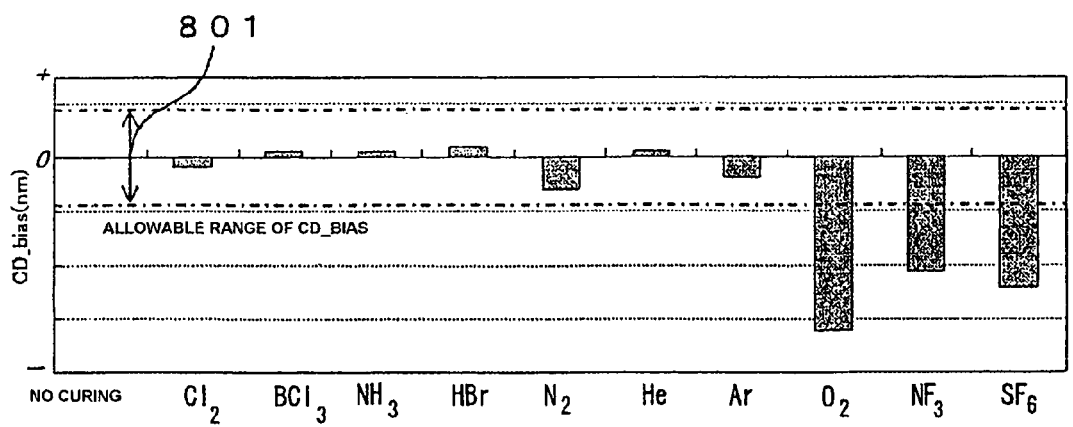
FIG. 8 is a view showing the plasma curing gas species dependency of CD-bias according to the plasma curing process of the first embodiment of the present invention.

Moreover, FIG. 8 shows the gas species dependency of CD-bias during the plasma curing process. CD-bias refers to the difference in CD (critical dimension) prior to the plasma curing process and the CD after the plasma curing process. When oxygen gas, nitrogen trifluoride gas and sulfur hexafluoride gas are used as the gas species for the plasma curing process, the etching rate of the photoresist material is increased, and the CD is greatly reduced, even eliminated. Furthermore, in the process of forming a MOS transistor, the CD of the gate length affects the transistor performance greatly, and therefore, the allowable range of the CD-bias is determined in advance. FIG. 8 shows an example of the CD-bias allowable range (801). If a gas species most effective in reducing LWR in the plasma curing process in FIG. 7 and within the CD-bias allowable range (801) in FIG. 8 is selected, the LWR is most reduced by the plasma curing process using nitrogen gas, and the LWR is secondly reduced by the plasma curing process using hydrogen bromide gas.

Therefore, the roughness on the side walls of the formed pattern and the LWR can be reduced via a plasma curing process using not only single gas such as nitrogen gas or hydrogen bromide gas, but also mixed gas composed of nitrogen gas and hydrogen bromide gas, mixed gas composed of nitrogen gas and gas containing rare gas elements, mixed gas composed of nitrogen gas and gas containing halogen elements, mixed gas composed of nitrogen gas, hydrogen bromide gas and gas containing rare gas elements, mixed gas composed of nitrogen gas, hydrogen bromide gas and gas containing halogen elements, and mixed gas composed of nitrogen gas, hydrogen bromide gas, gas containing rare gas elements and gas containing halogen elements.

However, when the plasma curing process is performed using a single gas of hydrogen bromide gas, the hydrogen bromide gas may react with a portion of the laminated thin films during plasma curing process, generating particles. The particles deteriorate the yield of the etching process, so it is more preferable to use nitrogen gas for the plasma curing process.

Furthermore, in general, hydrogen bromide gas is more expensive than nitrogen gas, and hydrogen bromide gas is poisonous to the human body. From viewpoints of both cost and environment of the etching process, it is more preferable to use nitrogen gas for the plasma curing process.

The use of a mixed gas composed of nitrogen gas and gas containing halogen elements to perform plasma curing process of the photoresist mask pattern enables to suppress increase or decrease of CD-bias and to enable etching to be performed with high accuracy with respect to the CD of the photoresist mask pattern.

Furthermore, by performing a plasma curing process using a mixed gas composed of nitrogen gas and gas containing rare gas elements to the photoresist mask pattern, it becomes possible to ensure a uniform plasma curing performance to be performed throughout the whole plane of the semiconductor substrate.

In the present example, the plasma processing pressure for performing the plasma curing process should preferably be 100 Pa or lower, since it is important that the pressure is equal to or lower than atmospheric pressure from the view point of plasma generation efficiency. In addition, since in extremely low pressure, the efficiency of plasma generation is deteriorated and also the reactive radical concentration reacting with resist polymer is deteriorated, the plasma processing pressure should preferably be equal to or greater than 0.1 Pa. In other words, the LWR reducing effect becomes significant when the pressure is 0.1 Pa or greater and 100 Pa or smaller.

Furthermore, the RF bias power applied to the material to be processed upon performing the plasma curing process must be equal to or greater than 0 W and equal to or smaller than 100 W. Specifically, the RF bias power should preferably be 0 W. This is because the photoresist material is sputtered and etched and the circuit pattern disappears if ions having high energy become incident on the material, so it is required that the RF bias power is set to 100 W or smaller to suppress sputtering and etching. Especially according to the plasma curing process of the present embodiment, the RF bias power is set to 0 W in order to suppress the sputtering and etching of the photoresist material.

Figure 9:
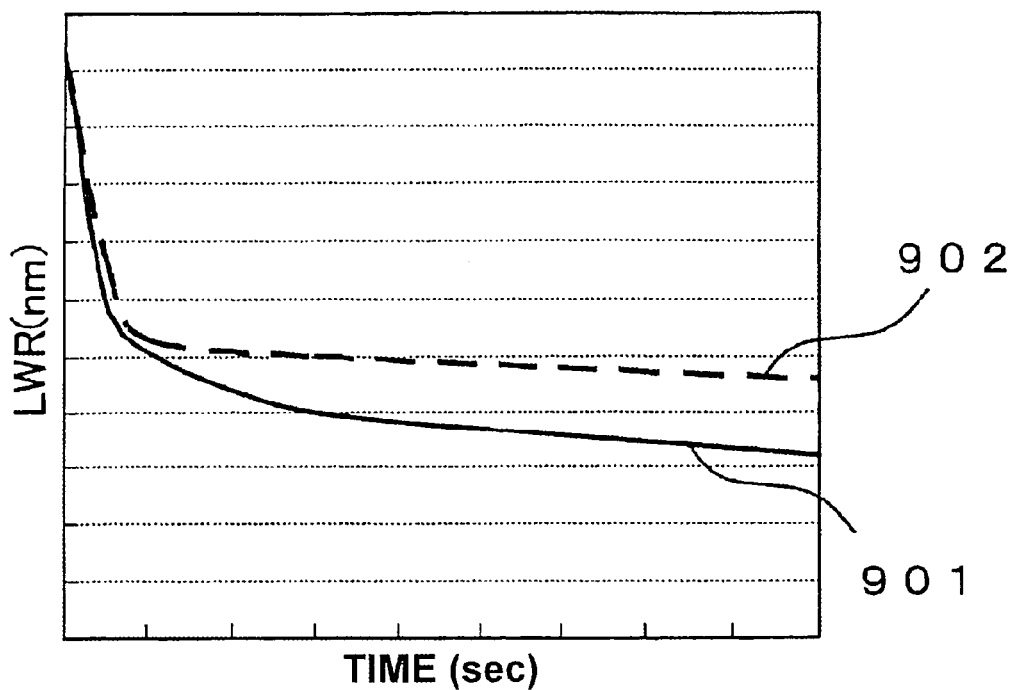
FIG. 9 is a view showing the plasma curing time dependency of LWR when nitrogen gas and hydrogen bromide gas are used in the plasma curing process according to the first embodiment of the present invention.

Moreover, FIG. 9 shows a plasma curing process time dependency (901) of the LWR value according to the plasma curing process using nitrogen gas, and the plasma curing process time dependency (902) of the LWR value according to the plasma curing process using hydrogen bromide gas. The LWR value is greatly improved during the initial extremely short time according to both plasma curing processes using nitrogen gas and hydrogen bromide gas, but a greater LWR reducing effect is achieved when the plasma curing process is performed using nitrogen gas to generate plasma. In other words, shorter plasma curing time is required to realize a predetermined LWR value when nitrogen gas is used. Therefore, the plasma curing process using nitrogen gas achieves higher throughput, which is the ability to process semiconductor substrates within a predetermined time. Therefore, upon processing a semiconductor substrate in a plasma processing apparatus, an etching process with higher throughput and higher accuracy is realized by performing a plasma curing process using nitrogen gas.

In the above description, various effects of the present embodiment have been actually described using as an example the etching process of a gate electrode of a MOS transistor with respect to the major thin film layers, plasma etching conditions and etching shapes, but equivalent effects can be realized by applying the present embodiment to thin film materials and semiconductor fabrication processes having similar properties.

Moreover, the effects of the present embodiment have been described specifically with respect to the pre-processing of the semiconductor device, but similar effects can be achieve by applying the present invention to a post-processing of the semiconductor device such as wire connection and super connection, or to etching processes in the fields of micromachining and MEMS such as displays, optical switches, communications, storages, sensors, imagers, small generators, small fuel cells, micro probers, processing gas control systems and medical biotechnologies.

Although the present embodiment has been described with reference to a plasma processing method using an etching apparatus adopting a microwave ECR discharge, similar effects can be achieved by using a dry etching apparatus adopting other discharge methods, such as magnetic field UHF discharge, capacitively coupled discharge, inductively coupled discharge, magnetron discharge, surface wave-excited discharge and transfer coupled discharge. However, the use of ECR discharge is more preferable to achieve an optimum plasma curing effect, since higher curing effects can be obtained by the controllability of the distance between the main plasma generating region and the wafer or the increased density of reactive radicals generated in the plasma with a high dissociation degree.

According to the plasma processing method of the first embodiment, gas containing nitrogen elements is used to subject a photoresist mask pattern to plasma curing process, wherein the roughness on the surface and side walls of the photoresist mask pattern is reduced, and thereafter, the multilayered thin films disposed below the photoresist mask pattern are subjected to plasma etching. Thus, the roughness on the side walls of the formed pattern is reduced and the generation of LER and LWR can be suppressed. Especially, the application of the present method to the processing of gate electrodes of a MOS transistor enables to realize highly accurate etching, and as a result, effectively improves the properties of the semiconductor device.

[Embodiment 2]

Figure 10:
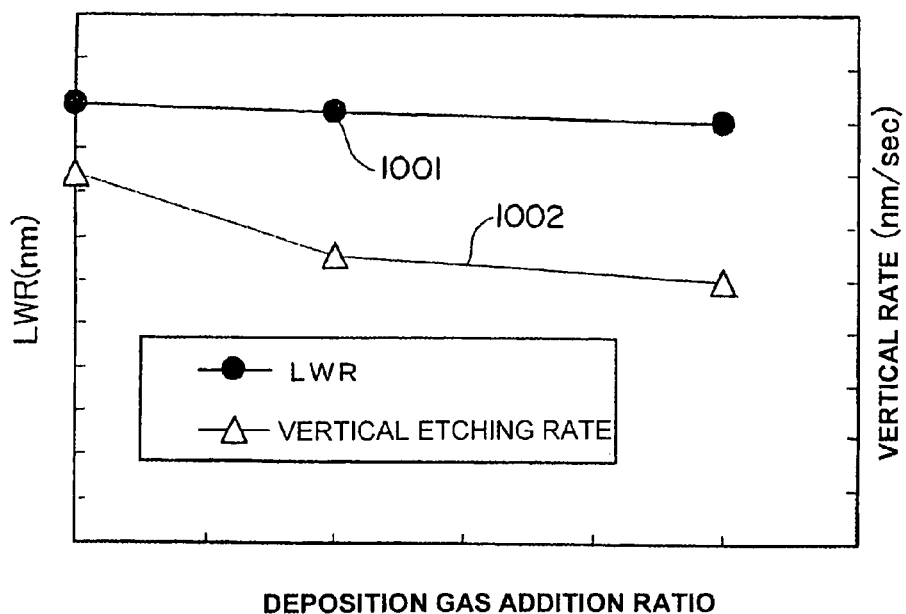
FIG. 10 is a view showing the deposition gas addition ratio dependency of the LWR and the vertical etching rate of the photoresist material during a plasma curing process when nitrogen gas and deposition gas are used in the plasma curing process according to a second embodiment of the present invention.

A second embodiment of the present invention will now be described with reference to FIG. 10. Only the features that differ from embodiment 1 are described hereafter. FIG. 10 shows a deposition gas flow rate dependency of the LWR and the vertical etching rate of the photoresist material when deposition gas is added to nitrogen gas as the processing gas of the plasma curing process. Heretofore, when a curing process is performed by using only deposition gases, elimination of lactone groups of the photoresist did not occur, and the roughness of the photoresist surface could not be reduced. In the present embodiment, a gas including methane gas diluted by rare gas is used as the deposition gas. When the quantity of the deposition gas being added is increased, the vertical etching rate (1002) of the photoresist material during the plasma curing process is reduced. However, even when the quantity of added deposition gas is increased, the LWR (1001) is not substantially changed. In other words, by adding the deposition gas to the nitrogen gas during the plasma curing process as according to the present embodiment, it becomes possible to suppress the vertical etching rate of the photoresist during the plasma curing process while reducing the roughness on the surface and side walls of the photoresist mask pattern.

Especially, along with the reduction in thickness of the photoresist mask pattern, the need to set the applied RF bias power to 0 W has increased, in order to suppress the vertical etching rate of the photoresist material during the plasma curing process and to ensure the necessary photoresist material layer thickness to remain required for performing the plasma etching process subsequent to the plasma curing process.

As described earlier, the size of semiconductor devices will surely be scaled down further in the future, and the photoresist material is predicted to have deteriorated etching durability and insufficient initial film thickness, which causes the occurrence of LER and LWR having even greater impact on the semiconductor device properties. Even if the size of semiconductor devices is scaled down with greater speed, the adding of deposition gas to nitrogen gas for performing the plasma curing process as according to the present embodiment enables to suppress the vertical etching rate of the photoresist during plasma curing process while reducing the roughness on the surface and side walls of the photoresist mask pattern, so the deterioration of etching durability and lack of initial film thickness can be solved.

In addition to the above-described embodiment, similar effects regarding the reduction of LER and LWR can be obtained by performing the plasma curing process to correspond to changes in the photoresist material accompanying the scaling down of the LSI (such as ArF resist, immersion ArF resist, EUV resist and nanoimprint resist), changes in the gate material of the MOS transistor (such as the metal layer and the high-k layer), and the changes in the exposure technique of photolithography (such as double patterning).

In the plasma processing method of the second embodiment, a plasma curing process is performed to a photoresist mask pattern by generating plasma using a gas mixture of a gas containing nitrogen elements and deposition gas, in order to suppress the vertical etching rate of the photoresist mask pattern and reduce the roughness on the surface and side walls of the photoresist mask pattern, and thereafter, subjecting the layered thin films disposed below the photoresist mask pattern to plasma etching process. Such arrangement enables to improve the roughness formed on the side walls of the pattern, and to suppress the generation of LER and LWR. Especially, the present embodiment can be applied to the processing of gate electrodes of a MOS transistor to enable highly accurate etching process and to improve the properties of the semiconductor device.

According to embodiments 1 and 2, the plasma processing method of the present invention provides a method for processing using plasma a material to be processed having thin films laminated on a semiconductor substrate and a photoresist mask pattern disposed on the laminated thin films, by which the roughness on the surface and side walls of the photoresist mask pattern can be reduced, and thereafter, the laminated thin film layers disposed below the photoresist mask pattern are subjected to plasma processing.

What is claimed is:

1. A plasma processing method for plasma etching a material to be processed including a plurality of thin films laminated on a semiconductor substrate and a photoresist mask pattern disposed on the laminated thin films, to form a gate electrode, the method comprising:
   at least one plasma curing step that reduces roughness on a surface and side wall of the photoresist mask pattern by plasma processing using only nitrogen gas ($N_2$); and
   at least one plasma etching step that etches all thin films of the laminated thin films, wherein each plasma etching step is performed subsequent a plasma curing step of the at least one plasma curing steps,
   wherein the at least one plasma curing step and the at least one plasma etching step are alternately repeated.

2. The plasma processing method according to claim 1, wherein a RF bias power applied to the material to be processed during the at least one plasma curing step of the photoresist mask pattern is set to 0 W.

3. The plasma processing method according to claim 1, wherein a processing temperature of the material to be processed during the at least one plasma curing step is 20° C. or higher and 200° C. or lower.

4. The plasma processing method according to claim 1, wherein a RF bias power applied to the material to be processed during the at least one plasma curing step of the photoresist mask pattern is set to 0 W or more or 100 W or less.

5. The plasma processing method according to claim 1, wherein the at least one plasma etching step is performed so as to form the gate electrode.

6. A plasma processing method for plasma etching material to be processed including a plurality of thin films laminated on a semiconductor substrate and a photoresist mask pattern disposed on the laminated thin films, to form a gate electrode, the method comprising:
   at least one plasma curing step that reduces roughness on a surface and side wall of the photoresist mask pattern by plasma processing using a gas mixture of nitrogen gas ($N_2$) and a deposition gas; and
   at least one plasma etching step that etches all thin films of the laminated thin films, wherein each plasma etching step is performed subsequent a plasma curing step of the at least one plasma curing steps,
   wherein the deposition gas is one or more gases selected from a group consisting of methane ($CH_4$), trifluoromethane ($CHF_3$), difluoromethane ($CH_2F_2$), fluoromethane ($CH_3F$), other fluorocarbon gases ($C_xF_y$) and silicon tetrafluoride ($SiF_4$), and
   wherein the at least one plasma curing step and the at least one plasma etching step are alternately repeated.

7. The plasma processing method according to claim 6, wherein a processing temperature of the material to be processed during the at least one plasma curing step is 20° C. or higher and 200° C. or lower.

8. The plasma processing method according to claim 6, wherein the at least one plasma etching step is performed so as to form the gate electrode.

9. The plasma processing method according to claim 6, wherein a RF bias power applied to the material to be processed during the at least one plasma curing step of the photoresist mask pattern is set to 0 W or more or 100 W or less.

10. The plasma processing method according to claim 9, wherein the RF bias power applied to the material to be processed during the at least one plasma curing step of the photoresist mask pattern is set to 0 W.

* * * * *